(12) United States Patent
Yamamoto et al.

(10) Patent No.: US 7,190,195 B2
(45) Date of Patent: Mar. 13, 2007

(54) INPUT CIRCUIT AND OUTPUT CIRCUIT

(75) Inventors: Isao Yamamoto, Kyoto (JP); Kyoichiro Araki, Kyoto (JP); Yoichi Tamegai, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 44 days.

(21) Appl. No.: 11/087,120

(22) Filed: Mar. 23, 2005

(65) Prior Publication Data

US 2005/0212569 A1    Sep. 29, 2005

(30) Foreign Application Priority Data

Mar. 29, 2004 (JP) .............................. 2004-096772

(51) Int. Cl.
*H03K 3/00* (2006.01)
(52) U.S. Cl. .................. 327/112; 327/379; 326/82; 326/86
(58) Field of Classification Search ..................... None
See application file for complete search history.

(56) References Cited

U.S. PATENT DOCUMENTS 5,424,897 A * 6/1995 Mietus et al. ................. 361/92
5,502,412 A * 3/1996 Choi et al. .................. 327/333
6,150,867 A * 11/2000 Genova et al. .............. 327/379
6,211,706 B1 * 4/2001 Choi et al. .................. 327/108

FOREIGN PATENT DOCUMENTS

JP    2001-296930    10/2001

* cited by examiner

*Primary Examiner*—Timothy P. Callahan
*Assistant Examiner*—An T. Luu
(74) *Attorney, Agent, or Firm*—Keating & Bennett, LLP

(57) ABSTRACT

An input circuit is provided which prevents malfunctioning of a function circuit during a power source voltage rise without the need of a separate Under Voltage Lock Out (UVLO) circuit. The input circuit includes a first transistor which receives an input terminal signal at a gate, a first resistor arranged between the transistor drain and a power source voltage, a second transistor arranged between the first transistor source and a ground potential, a second resistor arranged between the second transistor gate and the power source voltage, a third resistor arranged between the second transistor gate and the ground potential, a third transistor which receives the signal between the first transistor drain and the first resistor at the gate and connects and disconnects the path of the current which flows to the second and third resistors, and a fourth transistor which receives the signal of the input terminal IN at the gate and connects and disconnects the path of the current which flows to the second and third resistors.

18 Claims, 3 Drawing Sheets

INPUT CIRCUIT AND OUTPUT CIRCUIT

BACKGROUND OF THE INVENTION

1. Field of the Invention

The present invention relates to an input circuit and an output circuit for a semiconductor integrated circuit.

2. Description of the Related Art

Generally, an electronic apparatus including a plurality of semiconductor integrated circuits has a large capacitance provided by a plurality of capacitors and a large parasitic capacitance in the power line which supplies electrical power to the semiconductor integrated circuits. As a result, the power source voltage $V_{BAT}$ gradually rises. On the other hand, each semiconductor integrated circuit has a range of power source voltage $V_{BAT}$ so that a desired function or action can properly be achieved. Therefore, in order to stop the function of the semiconductor integrated circuits under a specified voltage, and to allow for the performance of the function of the semiconductor integrated circuits over the specified voltage, a UVLO (Under Voltage Lock Out) circuit is externally or internally provided and arranged to detect the specified voltage of power source voltage $V_{BAT}$ (See, for example, Japanese Patent Application Laid-Open No.2001-296930). Therefore, while the power source voltage $V_{BAT}$ rises, the semiconductor integrated circuit is prevented from malfunctioning by stopping the function thereof until the power source voltage $V_{BAT}$ reaches a voltage at which proper functioning is possible.

FIG. 3 shows an example of a conventional semiconductor integrated circuit with an internal UVLO circuit. The semiconductor integrated circuit 101 includes an input circuit 102 which inputs a signal from an input terminal IN, a function circuit 103 which actually performs the function of the semiconductor integrated circuit 101, and a UVLO circuit 104. The input circuit 102 is a circuit which inputs either a high-level or low level from the input terminal IN, and outputs a same polarity level as the input level. The input circuit 102 includes a N-type MOS transistor 111, the gate of which a signal from the input terminal IN is input to and the source of which is grounded, a resistor 116 arranged between the drain of the transistor 111 and the power source voltage $V_{BAT}$, and an inverter 119 which inputs a signal from the node between the drain of the transistor 111 and the resistor 116 and outputs a high-level or low level. The UVLO circuit 104 is a circuit which detects the specified voltage of the power source voltage $V_{BAT}$ and outputs a high level or low level. The UVLO circuit 104 includes resistors 131 and 132 which divide the power source voltage $V_{BAT}$, a reference voltage generating circuit 133 which generates a reference voltage $V_{REF}$, and a comparator 134 which compares the divided voltage of the power source voltage $V_{BAT}$ and the reference voltage $V_{REF}$ and outputs a high-level or low level. The output of the inverter 119 and the output of the comparator 134 are input to an AND circuit 135, and the output of the AND circuit 135 is input to the function circuit 103. The input voltage for the function circuit 103 will be fixed at a low level in order to stop (disable) the operation of the function circuit 103.

When the divided voltage of power source voltage $V_{BAT}$ is lower than the reference voltage $V_{REF}$, the UVLO circuit 104 determines that the power source voltage $V_{BAT}$ is not at a voltage capable for proper functioning and outputs a low level. Therefore, in this case, since the AND circuit 135 will output a low level, the function circuit 103 will not function.

Hence, the UVLO circuit 104 forces the function circuit 103 not to operate if the power source voltage $V_{BAT}$ is below a specified voltage where proper functioning is possible, so even if the power source voltage $V_{BAT}$ rises gradually, malfunctioning can be prevented. However, the UVLO circuit 104 is constantly comparing the power source voltage $V_{BAT}$ and the reference voltage $V_{REF}$, so a relatively large DC current is always flowing to the resistors 131 and 132, the reference voltage generating circuit 133, and the comparator 134. In other words, this DC current is flowing not only while the power source voltage $V_{BAT}$ rises, but even after the voltage rise is complete, so a significant amount of electrical power is consumed. Furthermore, the circuit volume of the UVLO circuit 104 is large. If the circuit volume of the function circuit 103 of the semiconductor integrated circuit 101 is small, achieving this type of internal UVLO circuit 104 will be actually difficult. On the other hand, if an external UVLO circuit 104 is used, a terminal for inputting that signal will be necessary, and it will be necessary to attach wiring from the external UVLO circuit 104 on the printed board.

SUMMARY OF THE INVENTION

In order to overcome the problems described above, preferred embodiments of the present invention provide an input circuit which can prevent malfunctioning during a power source voltage rise without using a UVLO circuit.

An input circuit according to a preferred embodiment of the present invention is an input circuit which receives an input signal from an input terminal and outputs a control signal to a function circuit, and includes an input transistor which receives an input signal from the input terminal at a control end, a first load element arranged between an output end of the input transistor and a first constant potential, a first control transistor arranged between an input end of the input transistor and a second constant potential, a second load element arranged between a control end of the first control transistor and the first constant potential, a third load element arranged between the control end of the first control transistor and the second constant potential, a second control transistor which turns ON and OFF to connect and disconnect the path of the current which flows through the second and third load elements by inputting a signal that is substantially the same as a signal at a node between the output end of the input transistor and the first load element into a control end, and a third control transistor which turns ON and OFF to connect and disconnect the path of the current which flows through the second and third load elements by inputting the input signal from the input terminal into the control end. The control signal is output to the function circuit depending on the signal at the node between the output end of the input transistor and the first load element.

An output circuit of another preferred embodiment of the present invention is an output circuit which receives a control signal from a function circuit and outputs an output signal to an output terminal, and includes an input transistor which receives a control signal from the function circuit at a control end, a first load element arranged between an output end of the input transistor and a first constant potential, a first control transistor arranged between an input end of the input transistor and a second constant potential, a second load element arranged between a control end of the first control transistor and the first constant potential, a third load element arranged between the control end of the first control transistor and the second constant potential, a second control transistor which turns ON and OFF to connect and disconnect the path of the current which flows through the second and third load elements by inputting a signal that is substantially the same as a signal at a node between the output end of the input transistor and the first load element into a control end, and a third control transistor which turns ON and OFF to connect and disconnect the path of the current which flows through the second and third load elements by inputting the control signal from the function circuit into the control end. The output signal is output to the output terminal depending on the signal at the node between the output end of the input transistor and the first load element.

An input circuit according to a preferred embodiment of the present invention described above has a first control transistor between the input end of the input transistor and the second constant potential. When the first constant potential is rising, the function circuit can be prevented from malfunctioning without using a UVLO circuit, by that the first control transistor is OFF until the proper functioning voltage of the function circuit is reached. Furthermore, the output circuit according to another preferred embodiment of the present invention described above can prevent malfunctioning in other semiconductor integrated circuits which receive a signal from the output circuit when the first constant potential is rising, by having a similar circuit structure as that of the input circuit described above. Thus, preferred embodiments of the present invention eliminate the need for a separate UVLO circuit in such input and output circuits.

Other elements, characteristics, features, properties, and advantages of the present invention will become clearer from the detailed description of the preferred embodiments of the present invention that is to be described next with reference to the attached drawings.

DETAILED DESCRIPTION OF THE PREFERRED EMBODIMENTS

Figure 1:
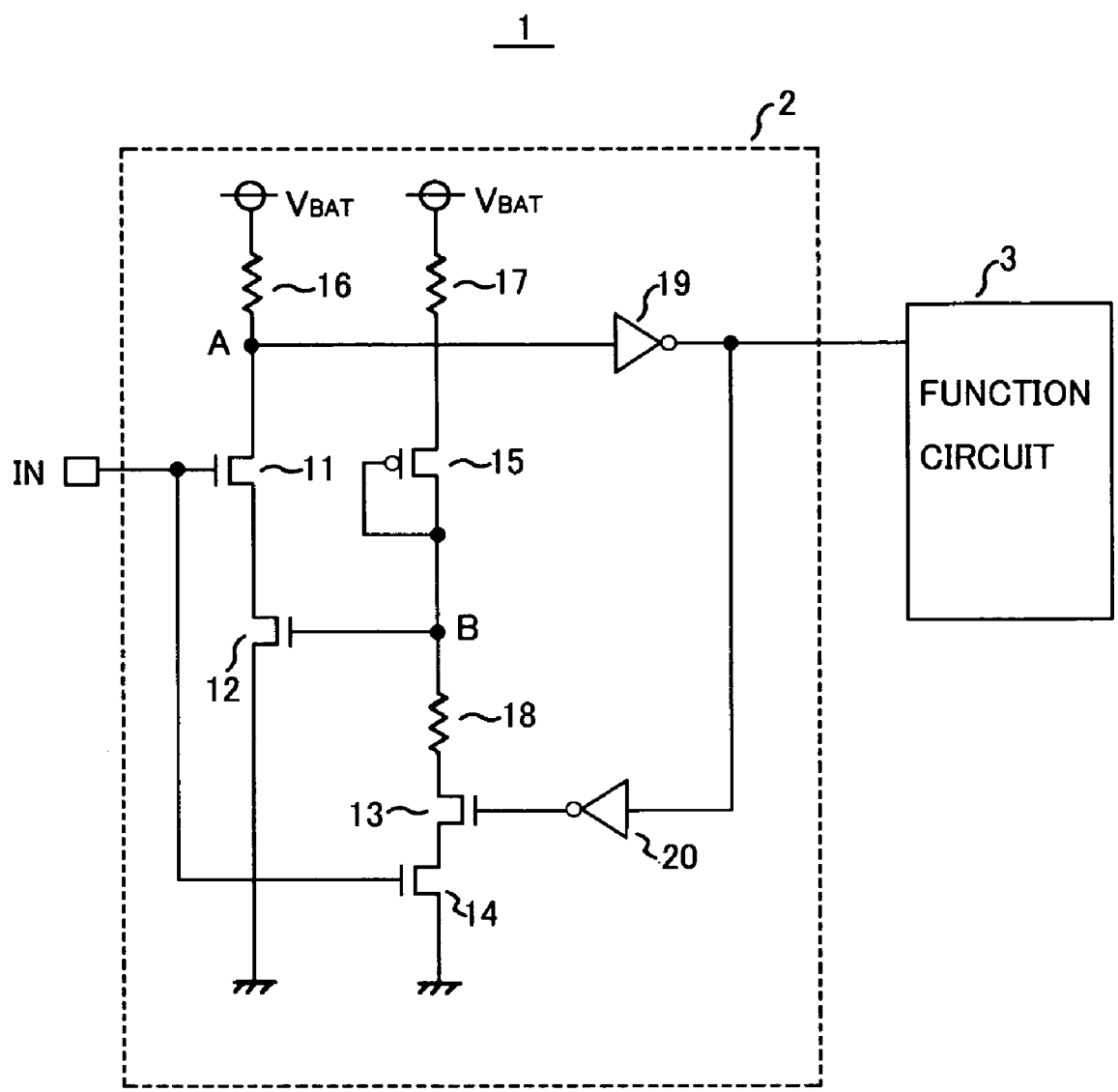
FIG. 1 is a circuit diagram of a semiconductor integrated circuit including an input circuit according to a preferred embodiment of the present invention.

Preferred embodiments of the present invention will be described below while referring to the drawings. FIG. 1 is a circuit diagram of a semiconductor integrated circuit including an input circuit according to a preferred embodiment of the present invention. This input circuit 2 includes an N-type MOS transistor (an input transistor) 11 which inputs an input signal from an input terminal IN into a gate (a control end), a resistor (a first load element) 16 arranged between a drain (an output end) of the input transistor 11 and a power source voltage $V_{BAT}$ (a first constant potential), an N-type MOS transistor (a first control transistor) 12 arranged between a source (an input terminal) of the input transistor 11 and a ground potential (a second constant potential), a resistor (a second load element) 17 arranged via a diode-connected P-type MOS transistor(a diode-connection transistor) 15 between a gate (a control end) (node B) of the first control transistor 12 and the power supply voltage $V_{BAT}$, a resistor (a third load element) 18 arranged between the gate of the first control transistor 12 and the ground potential, an N-type MOS transistor (a second control transistor) 13 which turns ON and OFF to connect and disconnect the path of the current which flows through the second and third load elements 17, 18 by inputting a signal at a node A between the drain of the input transistor 11 and the first load element 16 through inverters 19, 20 into a gate (a control end), and an N-type MOS transistor (a third control transistor) 14 which turns ON and OFF to connect and disconnect the path of the current which flows through the second and third load elements 17, 18 by inputting the input signal from the input terminal IN into a gate (a control end). The resistance values of the second and third load elements 17, 18 are preferably set to, for example, approximately R and 4R, respectively.

The function circuit 3 performs the function of the semiconductor integrated circuit 1, and the signal from the inverter 19, as the control signal that the input circuit 2 outputs, is input to the function circuit 3. The voltage of the input of the function circuit 3 is fixed at a low level in order to stop (disable) the operation of the function circuit 3. Therefore, as will be described below, in order to achieve a UVLO function while the power source voltage $V_{BAT}$ is rising, the control signal that the input circuit 2 outputs will be at a low level until a minimum voltage of power source voltage $V_{BAT}$ at which a proper function of the function circuit 3 is possible is reached.

Next, the operation of the input circuit 2 when the power source voltage $V_{BAT}$ gradually rises will be described. Note, for understanding, the threshold values Vth of the N-type MOS transistors and the P-type MOS transistors in the semiconductor integrated circuit 1 are preferably all the same value. Until the power source voltage $V_{BAT}$ reaches the voltage Vth, all of the transistors used in the function circuit 3 and the input circuit 2 which are part of the semiconductor integrated circuit 1 are in the OFF condition. The function circuit 3 is not able to function. Here, the voltage of node A will be at the level of power source voltage $V_{BAT}$. When power source voltage $V_{BAT}$ reaches the voltage Vth, the voltage level of node A will be transmitted to the gate of the second control transistor 13 through inverters 19, 20, and the second control transistor 13 will be turned ON. The third control transistor 14 will be ON if the input terminal is at a high level, and OFF if at a low level.

If the power source voltage $V_{BAT}$ is above the voltage Vth and the input terminal IN is at a high level, the voltage of node B will rise when power source voltage $V_{BAT}$ rises. However, if the voltage of node B is below the voltage Vth, the first control transistor 12 will be OFF. Therefore, the input transistor 11 will be ON because the input terminal IN is at a high level, but the voltage of node A will remain at the power source voltage $V_{BAT}$ level. On the other hand, if the input terminal IN is at a low level, the input transistor 11 will be OFF, so the voltage of node A will be at the power source voltage $V_{BAT}$ level. Hence, even if the power source voltage $V_{BAT}$ is above the voltage Vth, the voltage of node A will be at the level of power source voltage $V_{BAT}$ regardless of the voltage level of the input terminal IN until a specified voltage (UVLO cancellation voltage) is reached. Therefore, the voltage level of the control signal input to the function circuit 3 will be fixed at a low level and the function circuit 3 will be disabled.

The UVLO cancellation voltage of the power source voltage $V_{BAT}$ where the voltage of node B is at the voltage Vth is determined as shown below. When the voltage of node B is at Vth, a current of Vth/4R will flow through the third load element 18 and the same current will flow through the second load element 17, so:

$$V_{BAT} = Vth + Vth + (Vth/4R) \times R \quad (1)$$

and therefore:

$$V_{BAT} = Vth \times 9/4 \quad (2)$$

Therefore, if, for instance, Vth is about 0.7 V, $V_{BAT}$ will be about 1.575 V. This UVLO cancellation voltage can be adjusted as will be discussed later.

Next, when the power source voltage $V_{BAT}$ exceeds the UVLO cancellation voltage of Equation (2), the disabled condition of function circuit 3 will be canceled. It should be noted that the UVLO cancellation voltage must be adjusted such that the function circuit 3 can properly function at least above this UVLO cancellation voltage. Furthermore, the first control transistor 12 will be ON regardless of the voltage level of the input terminal IN, so if the input terminal IN is at a high level, the input transistor 11 will be ON, and node A will be at a low level because the current will flow through the first load element 16, and then this will be inverted by inverter 19 to a high level. Conversely, if the input terminal IN is at a low level, the input transistor 11 will be OFF, current will not flow through the first load element 16 so node A will be at a high level, and then this will be inverted by inverter 19 to a low level. Therefore, the polarity of the input terminal IN will remain at the polarity of the control signal input to the function circuit 3. Note, the polarity of the input terminal IN and node A are different, so the second and third control transistors 13, 14 will normally not both be ON. Therefore, almost no current will flow through the second and third load elements 17, 18.

Therefore, until the power source voltage $V_{BAT}$ gradually rises and reaches the power source voltage $V_{BAT}$ at which a proper operation is possible, functioning can be stopped and malfunctioning can be prevented by the input circuit 2 with UVLO functionality added, which does not hardly increase the circuit size.

Next, specific adjustments of the UVLO cancellation voltage will be described. In order to adjust the UVLO cancellation voltage to the minimum voltage of power source voltage $V_{BAT}$ where proper operation of the function circuit 3 is possible, the ratio of the resistance values of the second and third load elements 17, 18 can be changed, the transistor 15 can be eliminated, or conversely two or more transistors 15 can be used. For instance, if the resistance value of the second and third load element 17, 18 are set, for example, to R and 3R, respectively, and two transistors 15 are used in series, Equation (1) will change to:

$$V_{BAT}=Vth+2\times Vth+(Vth/3R)\times R \quad (3)$$

and therefore:

$$V_{BAT}=Vth\times 10/3 \quad (4)$$

so the UVLO cancellation voltage will be higher than Equation (2).

Incidentally, the minimum voltage of the power source voltage $V_{BAT}$ at which proper operation of the function circuit 3 is possible is strongly affected by the Vth value of the transistor. On the other hand, the UVLO cancellation voltage is also determined by Vth as shown in Equation (2) and Equation (4). Therefore, even if Vth changes because of the temperature or other condition, a similar change will occur and the relative relationship will not change significantly among these two voltages. Therefore, the margin between these two voltage values can be reduced. As a result, the range of the power source voltage $V_{BAT}$ where the function circuit 3 can function (substantial operating range) can be increased, and the function circuit 3 can be made to function early during the power source voltage $V_{BAT}$ rise.

The above described case is one in which the disabling voltage level of the control signal of the function circuit 3 was the low level, but if the disabling voltage level of the control signal is at a high level, the output of inverter 20 in place of the output of the inverter 19 will be input to the function circuit 3. Furthermore, the signal input into the gate of the second control transistor 13 is substantially the same as the signal at the node A by passing through the inverters 19, 20. However, the signal at the node A can be directly input into the gate of the second control transistor 13 without passing through the inverters 19, 20. Furthermore, in the input circuit 2, the first constant potential will be the power source voltage $V_{BAT}$ and the second constant potential will be the ground potential. However, this can be reversed so that the ground potential is the first constant potential and the power source voltage $V_{BAT}$ is the second constant potential. In this case, transistors 11 through 14 are preferably P-type MOS transistors and transistor 15 is preferably an N-type MOS transistor. Furthermore, the input circuit 2 preferably uses MOS transistors, but all or part of these can be replaced with bipolar transistors.

Figure 2:
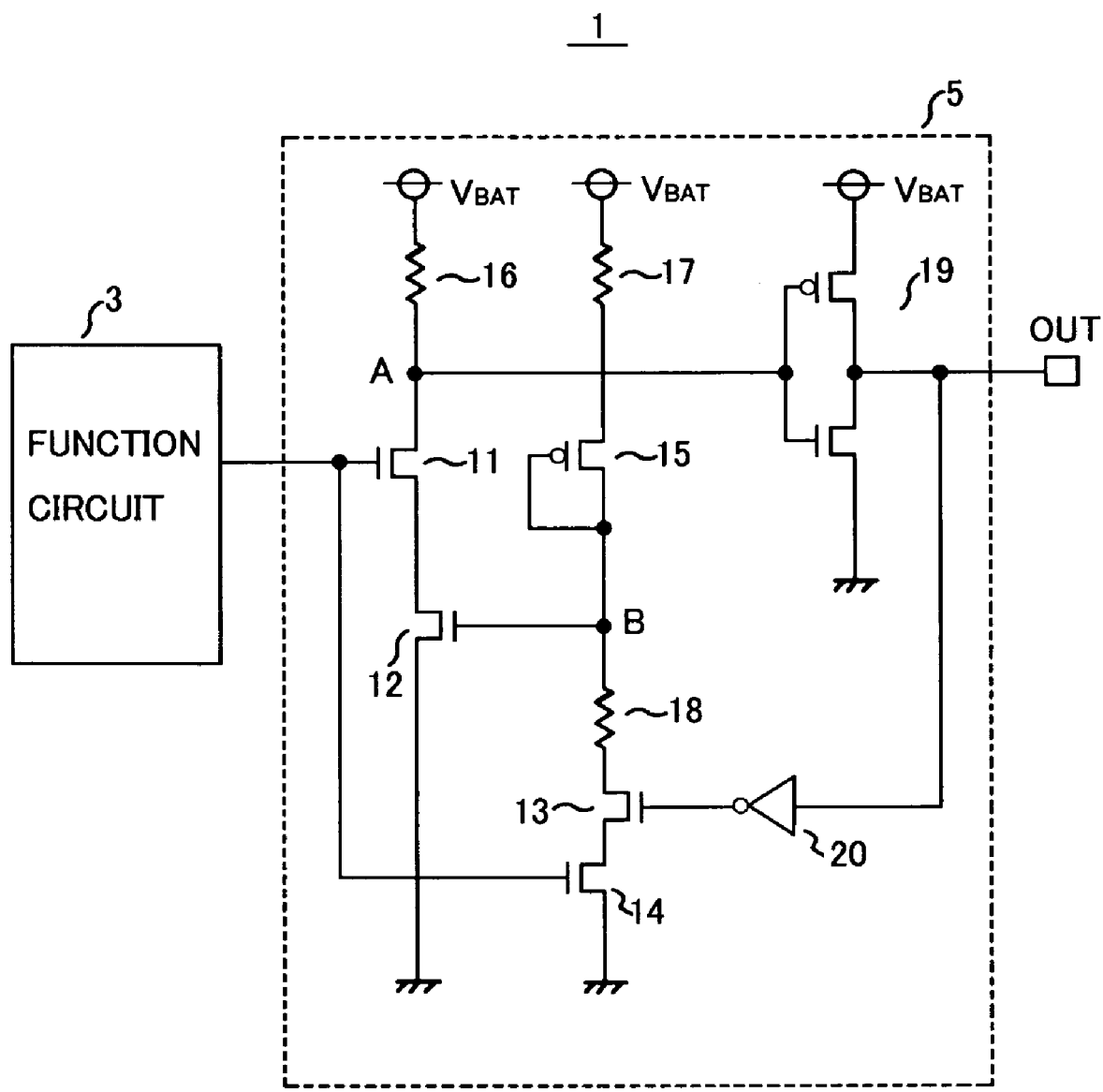
FIG. 2 is a circuit diagram of a semiconductor integrated circuit including an output circuit according to another preferred embodiment of the present invention.
Figure 3:
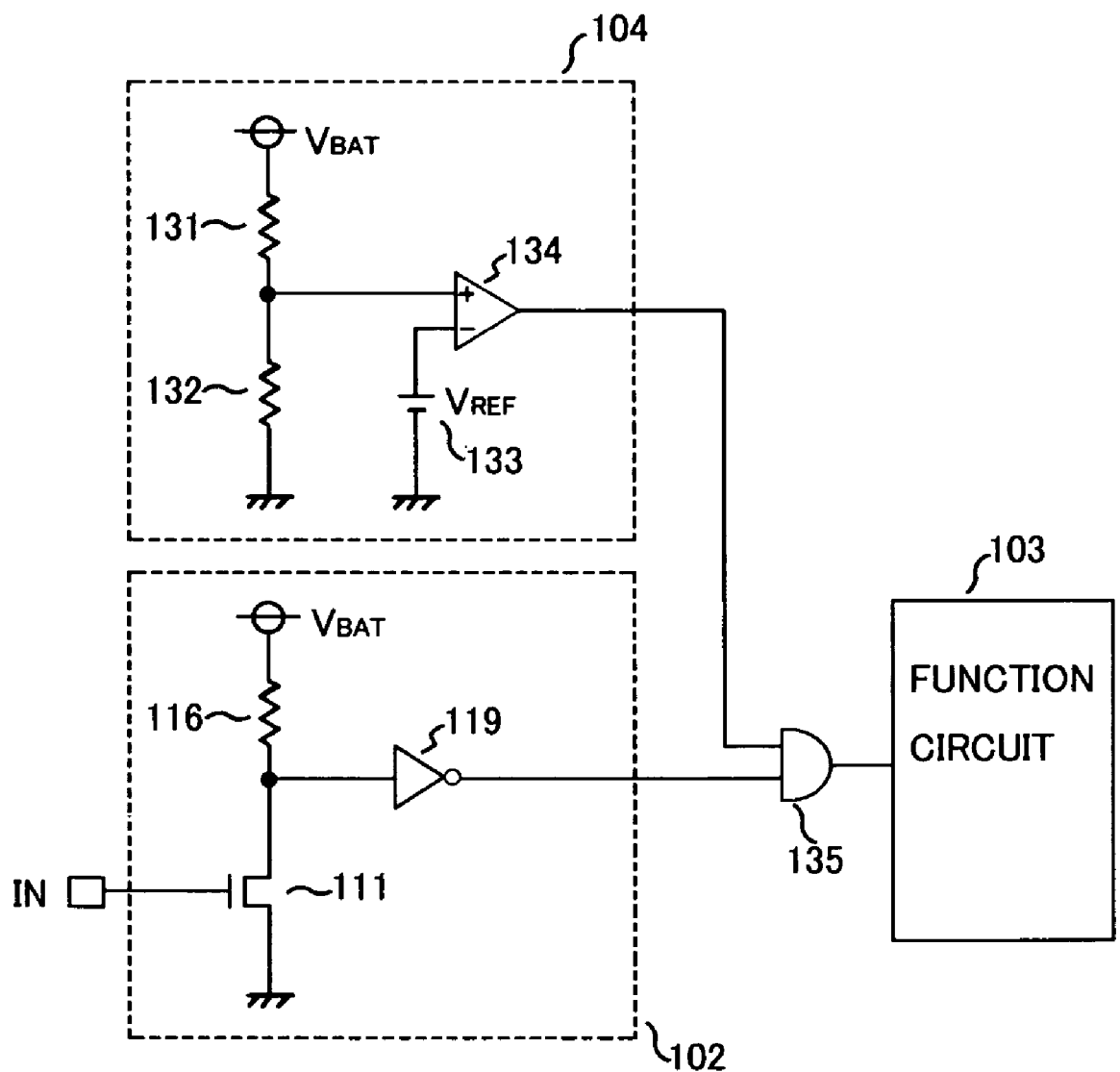
FIG. 3 is a circuit diagram of a semiconductor integrated circuit including a conventional input circuit.

An input circuit according to one preferred embodiment of the present invention was described above, but it is also possible to provide an output circuit which prevents malfunctioning of other semiconductor integrated circuits during the power source voltage $V_{BAT}$ rise by stopping the operation until a power source $V_{BAT}$ reaches the voltage at which the proper operation of the other semiconductor integrated circuits is possible. FIG. 2 is a circuit diagram of a semiconductor integrated circuit including an output circuit according to another preferred embodiment of the present invention. This output circuit 5 preferably has substantially the same circuit structure as the aforementioned input circuit 2 of FIG. 1. However, the control signal output from function circuit 3 is input to the output circuit 5, and the output signal from the output circuit 5 is output to an output terminal OUT. Furthermore, the size of the N-type and P-type MOS transistors, which define the inverter 19, is preferably increased. The duplicate description of other elements will be omitted. This output circuit 5 functions similarly to the above-described input circuit 2, so by adjusting the UVLO cancellation voltage to the minimum voltage of power source voltage $V_{BAT}$ at which proper functioning of the other semiconductor integrated circuit is possible, the other semiconductor integrated circuit which receives the signal of output circuit 5 can be controlled and prevented from malfunctioning during the power source voltage $V_{BAT}$ rise.

While the present invention has been described with respect to preferred embodiments thereof, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

What is claimed is:

1. An input circuit which receives an input signal from an input terminal and outputs a control signal to a function circuit, comprising:
   an input transistor arranged to receive an input signal from the input terminal at a control end;
   a first load element arranged between an output end of the input transistor and a first constant potential;
   a first control transistor arranged between an input end of the input transistor and a second constant potential;
   a second load element arranged between a control end of the first control transistor and the first constant potential;
   a third load element arranged between the control end of the first control transistor and the second constant potential;

a second control transistor which turns ON and OFF to connect and disconnect a current which flows through the second and third load elements by inputting a signal that is substantially the same as a signal at a node between the output end of the input transistor and the first load element into a control end; and a third control transistor which turns ON and OFF to connect and disconnect a current which flows through the second and third load elements by inputting the input signal from the input terminal into a control end; wherein the control signal is output to the function circuit depending on the signal at the node between the output end of the input transistor and the first load element.

2. The input circuit according to claim 1, further comprising a diode-connection transistor arranged between the control end of the first control transistor and the second load element.

3. The input circuit according to claim 1, wherein the signal that is substantially the same as the signal at the node between the output end of the input transistor and the first load element is input into the control end of the second control transistor by a plurality of inverters arranged between the node between the output end of the input transistor and the first load element and the control end of the second control transistor.

4. The input circuit according to claim 2, wherein the signal that is substantially the same as the signal at the node between the output end of the input transistor and the first load element is input into the control end of the second control transistor by a plurality of inverters arranged between the node between the output end of the input transistor and the first load element and the control end of the second control transistor.

5. The input circuit according to claim 1, wherein the input transistor, the first control transistor, the second control transistor and the third control transistor are MOS transistors, and a control end, an output end and an input end of each transistor are respectively a gate, a drain and a source.

6. The input circuit according to claim 2, wherein the input transistor, the first control transistor, the second control transistor, the third control transistor and the diode-connection transistor are MOS transistors, and a control end, an output end and an input end of each transistor are respectively a gate, a drain and a source.

7. The input circuit according to claim 5, wherein the first constant potential and the second constant potential are respectively the power source potential and the ground potential, and the input transistor, the first control transistor, the second control transistor and the third control transistor are N-type MOS transistors.

8. The input circuit according to claim 6, wherein the first constant potential and the second constant potential are respectively the power source potential and the ground potential, the input transistor, the first control transistor, the second control transistor and the third control transistor are N-type MOS transistors, and the diode-connection transistor is a P-type MOS transistor.

9. The input circuit according to claim 1, wherein the first load element, the second load element and the third load element include resistors.

10. An output circuit which receives a control signal from a function circuit and outputs an output signal to an output terminal, comprising:

an input transistor arranged to receive a control signal from the function circuit at a control end;

a first load element arranged between an output end of the input transistor and a first constant potential;

a first control transistor arranged between an input end of the input transistor and a second constant potential;

a second load element arranged between a control end of the first control transistor and the first constant potential;

a third load element arranged between the control end of the first control transistor and the second constant potential;

a second control transistor which turns ON and OFF to connect and disconnect the current which flows through the second and third load elements by inputting a signal that is substantially the same as a signal at a node between the output end of the input transistor and the first load element into a control end; and a third control transistor which turns ON and OFF to connect and disconnect the current which flows through the second and third load elements by inputting the control signal from the function circuit into the control end; wherein the output signal is output to the output terminal depending on the signal at the node between the output end of the input transistor and the first load element.

11. The output circuit according to claim 10, further comprising a diode-connection transistor arranged between the control end of the first control transistor and the second load element.

12. The output circuit according to claim 10, wherein the signal that is substantially the same as the signal at the node between the output end of the input transistor and the first load element is input into the control end of the second control transistor by a plurality of inverters arranged between the node between the output end of the input transistor and the first load element and the control end of the second control transistor.

13. The output circuit according to claim 11, wherein the signal that is substantially the same as the signal at the node between the output end of the input transistor and the first load element is input into the control end of the second control transistor by a plurality of inverters arranged between the node between the output end of the input transistor and the first load element and the control end of the second control transistor.

14. The output circuit according to claim 10, wherein the input transistor, the first control transistor, the second control transistor and the third control transistor are MOS transistors, and a control end, an output end and an input end of each transistor are respectively a gate, a drain and a source.

15. The output circuit according to claim 11, wherein the input transistor, the first control transistor, the second control transistor, the third control transistor and the diode-connection transistor are MOS transistors, and a control end, an output end and an input end of each transistor are respectively a gate, a drain and a source.

16. The output circuit according to claim 14, wherein the first constant potential and the second constant potential are respectively the power source potential and the ground potential, and the input transistor, the first control transistor, the second control transistor and the third control transistor are N-type MOS transistors.

17. The output circuit according to claim 15, wherein the first constant potential and the second constant potential are respectively the power source potential and the ground potential, the input transistor, the first control transistor, the second control transistor and the third control transistor are N-type MOS transistors, and the diode-connection transistor is a P-type MOS transistor.

18. The output circuit according to claim 10, wherein the first load element, the second load element and the third load element include resistors.

* * * * *